United States Patent
Yu et al.

(10) Patent No.: US 11,804,583 B2
(45) Date of Patent: Oct. 31, 2023

(54) LIGHT EMITTING DEVICE AND METHOD FOR MANUFACTURING THE SAME

(71) Applicant: Au Optronics Corporation, Hsinchu (TW)

(72) Inventors: Fang-Cheng Yu, Hsinchu (TW); Cheng-Chieh Chang, Hsinchu (TW); Cheng-Yeh Tsai, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 224 days.

(21) Appl. No.: 16/953,337

(22) Filed: Nov. 20, 2020

(65) Prior Publication Data
US 2021/0391516 A1 Dec. 16, 2021

(30) Foreign Application Priority Data
Jun. 12, 2020 (TW) .................................. 109119786

(51) Int. Cl.
*H01L 33/62* (2010.01)
*H01L 33/00* (2010.01)
*H01L 33/38* (2010.01)

(52) U.S. Cl.
CPC .......... *H01L 33/62* (2013.01); *H01L 33/0095* (2013.01); *H01L 33/382* (2013.01);
(Continued)

(58) Field of Classification Search
CPC ... H01L 2224/02135; H01L 2224/0213; H01L 2224/02126; H01L 2224/02125;
(Continued)

(56) References Cited

U.S. PATENT DOCUMENTS

| 2019/0181317 A1* | 6/2019 | Yu ........................ H01L 25/0753 |
| 2019/0319163 A1 | 10/2019 | Schuele et al. |
| 2022/0208738 A1* | 6/2022 | Chaji ...................... H01L 24/73 |

FOREIGN PATENT DOCUMENTS

| CN | 110783254 | 2/2020 |
| DE | 102020202613 A1 * | 9/2021 |

(Continued)

OTHER PUBLICATIONS

DE-102020202613-A1 english translation.*

*Primary Examiner* — Latanya N Crawford Eason
(74) *Attorney, Agent, or Firm* — JCIPRNET

(57) ABSTRACT

A light emitting device including a substrate, a first pad, a second pad, a light emitting diode, a first connection structure, a second connection structure, and a patterned adhesive layer and a method for manufacturing the same are provided. The first pad and the second pad are located on the substrate. The light emitting diode includes a first semiconductor layer, a second semiconductor layer overlapping the first semiconductor layer, a first electrode and a second electrode. The first electrode and the second electrode are respectively connected to the first semiconductor layer and the second semiconductor layer. The first connection structure electrically connects the first electrode to the first pad. The second connection structure electrically connects the second electrode to the second pad. The patterned adhesive layer is located between the substrate and the light emitting diode and does not contact the first connection structure and the second connection structure.

7 Claims, 9 Drawing Sheets

(52) U.S. Cl.
CPC .............. *H01L 2933/0016* (2013.01); *H01L 2933/0066* (2013.01)

(58) Field of Classification Search
CPC ... H01L 2224/0214; H01L 2224/10125; H01L 2224/10126; H01L 2224/10135; H01L 2224/10145; H01L 33/62; H01L 2933/0016; H01L 2933/0066
See application file for complete search history.

(56) References Cited

FOREIGN PATENT DOCUMENTS

| | | |
|---|---|---|
| TW | 201626555 | 7/2016 |
| TW | 201810709 | 3/2018 |
| TW | 202015140 | 4/2020 |

\* cited by examiner

LIGHT EMITTING DEVICE AND METHOD FOR MANUFACTURING THE SAME

CROSS-REFERENCE TO RELATED APPLICATION

This application claims the priority benefit of Taiwanese application serial no. 109119786, filed on Jun. 12, 2020. The entirety of the above-mentioned patent application is hereby incorporated by reference herein and made a part of this specification.

BACKGROUND

Technical Field

The disclosure relates to a light emitting device, and in particular relates to a light emitting device having a light emitting diode.

Description of Related Art

Light emitting diode displays have advantages of high brightness, low power consumption, high resolution, high color saturation, and the like. Therefore, many manufacturers are committed to the development of technology related to the light emitting diode display. Currently, many technical bottlenecks still await to be overcome during the development of light emitting diode displays, among which mass transfer technology is one of the most critical. Mass transfer technology is a technology that transfers micro light emitting diodes from the growing substrate to the active device substrate. Since a large number of micro light emitting diodes are to be transferred at the same time, accuracy in aligning the micro light emitting diodes is especially important. In existing technology, the micro light emitting diode are often deviated during the transfer process, preventing the micro light emitting diodes on pixel array substrates from normal operation.

SUMMARY

The disclosure provides a light emitting device that increases alignment accuracy of the light emitting diode.

The disclosure provides a method for manufacturing a light emitting device that increases alignment accuracy of the light emitting diode.

At least one embodiment of the disclosure provides a light emitting device, including a substrate, a first pad, a second pad, a light emitting diode, a first connection structure, a second connection structure, and a patterned adhesive layer. The first pad and second pad are located on the substrate. The light emitting diode includes a first semiconductor layer, a second semiconductor layer overlapping the first semiconductor layer, a first electrode, and a second electrode. The first electrode and the second electrode are respectively connected to the first semiconductor layer and the second semiconductor layer. The first connection structure electrically connects the first electrode to the first pad. The second connection structure electrically connects the second electrode to the second pad. The patterned adhesive layer is located between the substrate and the light emitting diode and does not contact the first connection structure and the second connection structure.

At least one embodiment of the disclosure provides a method for manufacturing a light emitting device, including the following. A first pad and a second pad are provided on a substrate. A first conductive structure and a second conductive structure are respectively formed on the first pad and the second pad. An adhesive material layer is formed on the substrate. A soft-baking process is performed on the adhesive material layer, and the adhesive material layer is patterned, where the patterned adhesive material layer does not contact the first conductive structure and the second conductive structure. A light emitting diode is placed on the patterned adhesive material layer. The light emitting diode includes a first semiconductor layer, a second semiconductor layer overlapping the first semiconductor layer, a first electrode and a second electrode. The first electrode and the second electrode are respectively connected to the first semiconductor layer and the second semiconductor layer, and the first electrode and the second electrode are respectively connected to the first conductive structure and the second conductive structure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIG. 1A to FIG. 1K are schematic cross-sectional views of a method for manufacturing a light emitting device according to an embodiment of the disclosure. FIG. 2 is a schematic top view of a light emitting device according to an embodiment of the disclosure.

Figure 1A:
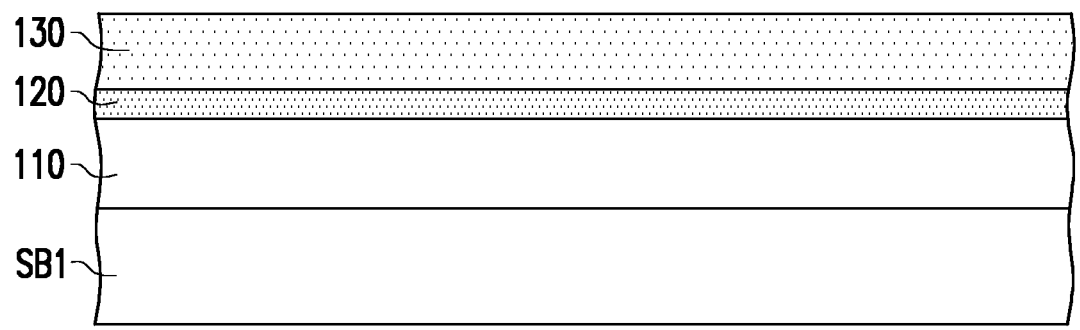
FIG. 1A to FIG. 1K are schematic cross-sectional views of a method for manufacturing a light emitting device according to an embodiment of the disclosure.
Figure 2:
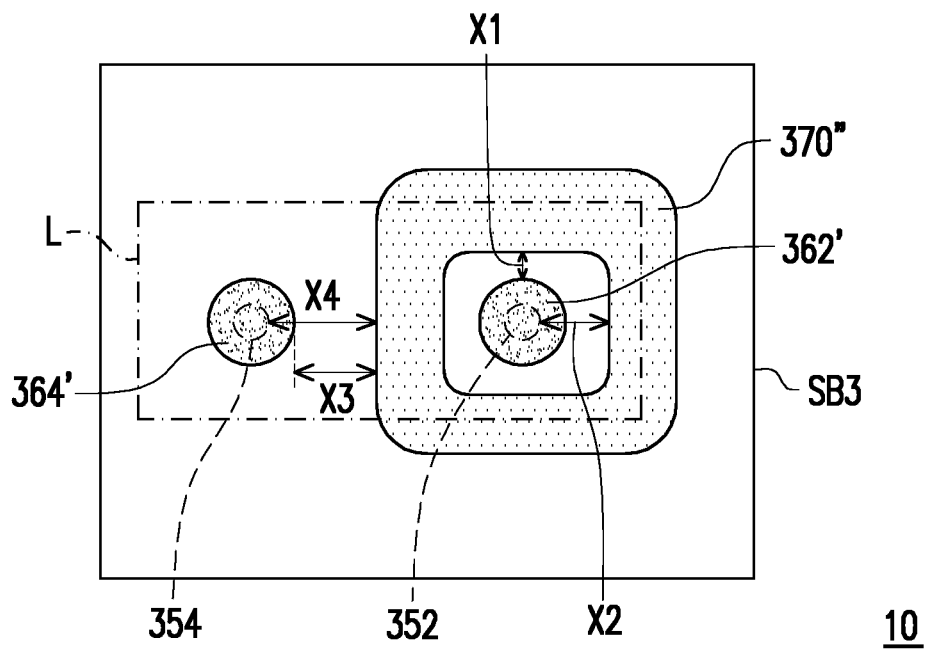
FIG. 2 is a schematic top view of a light emitting device according to an embodiment of the disclosure.

With reference to FIG. 1A, a first semiconductor material layer 110 is formed on a growing substrate SB1. A second semiconductor material layer 130 is formed on the first semiconductor material layer 110. In this embodiment, an intervening material layer 120 is also formed on the first semiconductor material layer 110 before the second semiconductor material layer 130 is formed. The growing substrate SB1, for example, is a sapphire substrate, a gallium phosphide substrate, a gallium arsenide substrate, a silicon carbide substrate, or other applicable substrates. The first semiconductor material layer 110 and the second semiconductor material layer 130 are respectively semiconductor materials with different types of doping.

Figure 1B:
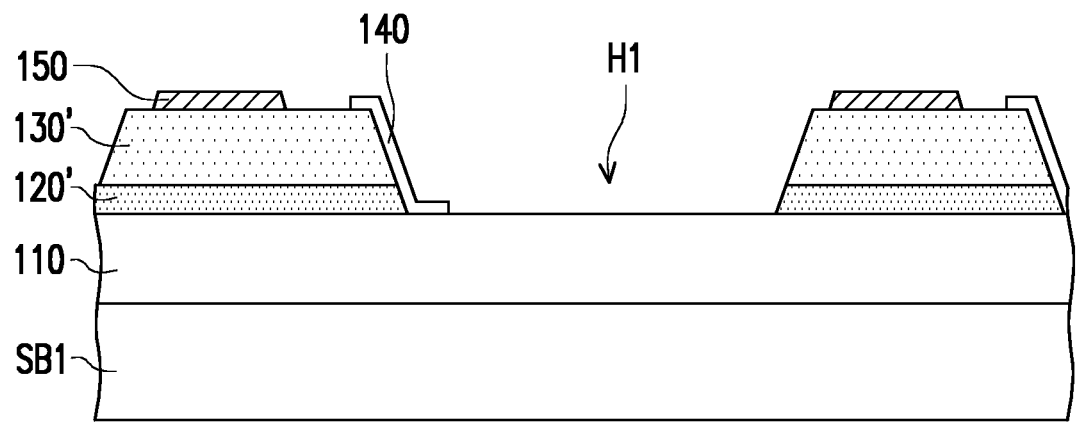

With reference to FIG. 1B, the second semiconductor material layer 130 and the intervening material layer 120 are patterned to form a second semiconductor layer 130' and a light emitting layer 120'. An opening H1 penetrates the second semiconductor layer 130' and the light emitting layer 120', and the opening H1 exposes a top surface of the first semiconductor material layer 110.

An insulating layer 140 is formed on a sidewall of the second semiconductor layer 130' and the light emitting layer 120'. The insulating layer 140 exposes the top surface of the first semiconductor material layer 110 and a top surface of the second semiconductor layer 130'. A second electrode 150 is formed on the top surface of the second semiconductor layer 130'.

Figure 1C:
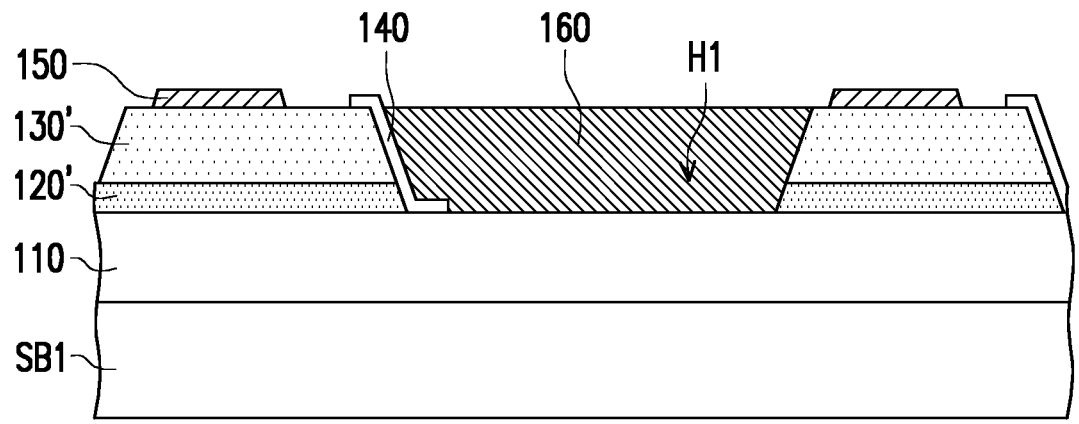

With reference to FIG. 1C, a metal material layer 160 is formed in the opening H1, where the metal material layer 160 contacts the insulating layer 140. In some embodiments, the material of the metal material layer 160 is different from the material of the second electrode 150, but the disclosure is not limited thereto. In other embodiments, the material of the metal material layer 160 is same as the material of the second electrode 150.

Figure 1D:
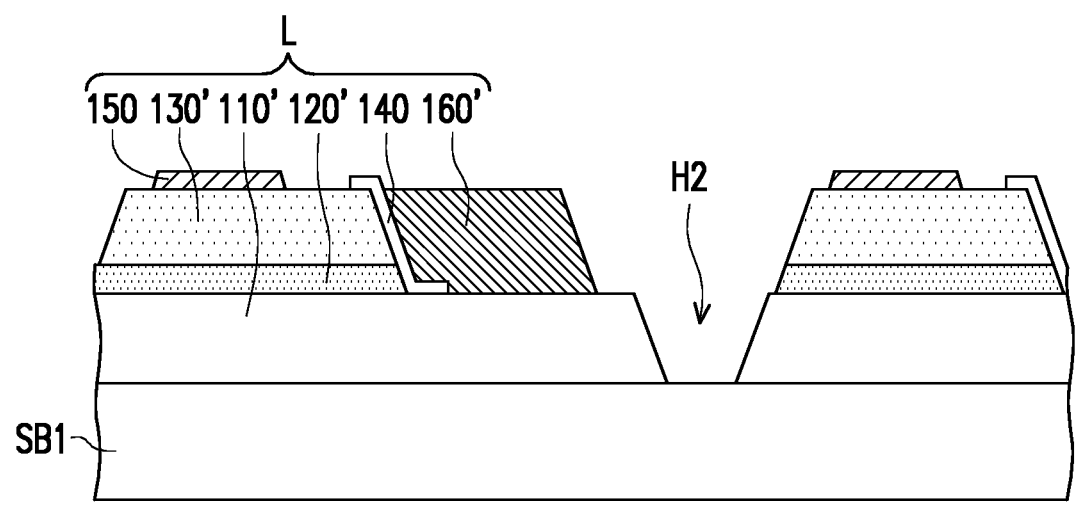

With reference to FIG. 1D, the first semiconductor material layer 110 and the metal material layer 160 are patterned to form a first semiconductor layer 110' and a first electrode 160'. An opening H2 penetrates the first electrode 160' and the first semiconductor layer 110'. In some embodiments, a thickness of the first electrode 160' is greater than a thickness of the second electrode 150, which thereby reduces a level height difference between a top surface of the first electrode 160' and a top surface of the second electrode 150.

A light emitting diode L includes the first semiconductor layer 110', the second semiconductor layer 130' overlapping the first semiconductor layer 110', the first electrode 160', and the second electrode 150. The first electrode 160' and the second electrode 150 are respectively connected to the first semiconductor layer 110' and the second semiconductor layer 130'. In this embodiment, the light emitting diode L further includes the light emitting layer 120' and the insulating layer 140. The light emitting layer 120' is located between the first semiconductor layer 110' and the second semiconductor layer 130'. The insulating layer 140 is located on the sidewall of the second semiconductor layer 130' and the light emitting layer 120' and separates the second semiconductor layer 130' from the first electrode 160'.

Figure 1E:
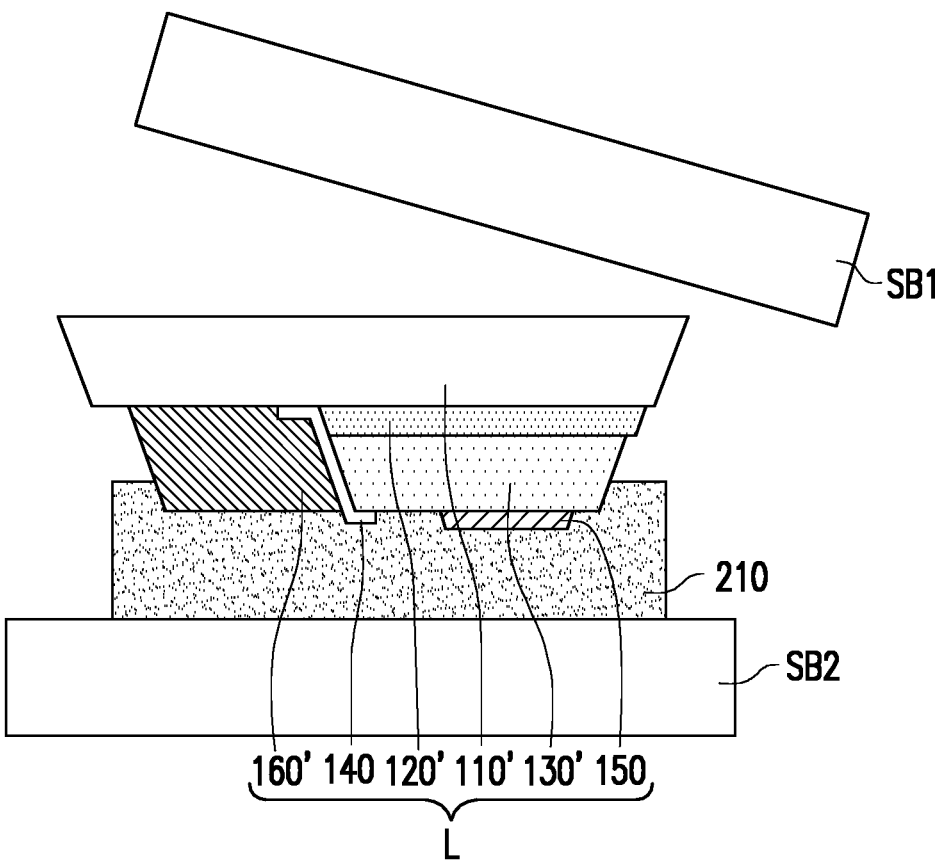

With reference to FIG. 1E, the light emitting diode L is transferred onto an interposer substrate SB2, and then the growing substrate SB1 is removed. The method for removing the growing substrate SB1, for example, includes laser lift-off. In this embodiment, the side of the light emitting diode L provided with the first electrode 160' and the second electrode 150 faces the interposer substrate SB2.

In this embodiment, the interposer substrate SB2 has a sacrificial layer 210, and the light emitting diode L is disposed on the sacrificial layer 210.

Figure 1F:
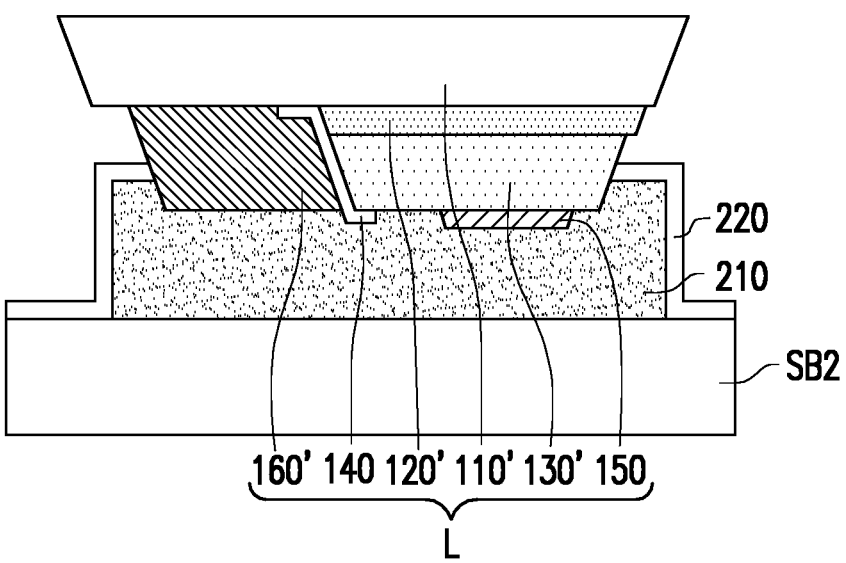

With reference to FIG. 1F, a tether layer 220 is formed on the light emitting diode L and the sacrificial layer 210. In this embodiment, the tether layer 220 contacts the first electrode 160' and the second semiconductor layer 130' of the light emitting diode L, but the disclosure is not limited thereto. In other embodiments, the tether layer 220 contacts the first semiconductor layer 110' of the light emitting diode L.

Figure 1G:
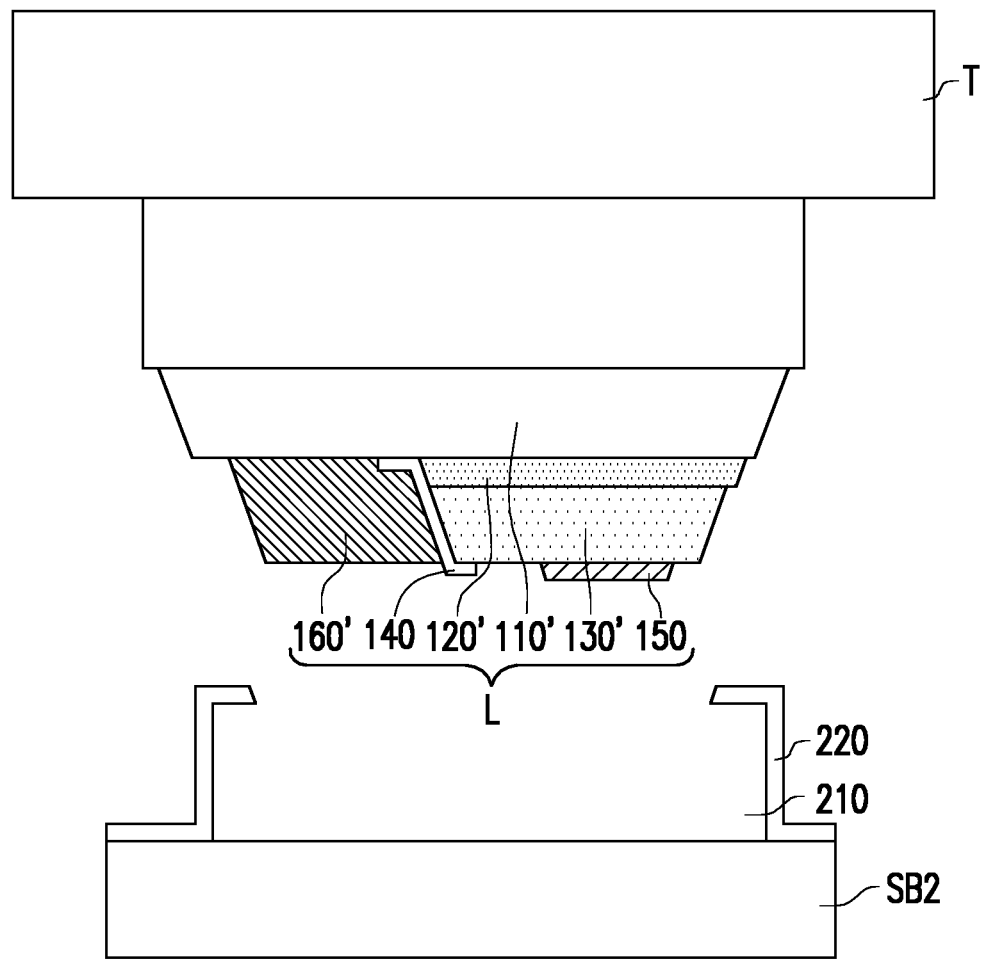

With reference to FIG. 1G, the sacrificial layer 210 is removed, and then a transfer apparatus T is adopted to lift the light emitting diode L from the interposer substrate SB2.

In this embodiment, the tether layer 220 remains on the interposer substrate SB2. In other embodiments, a part of the tether layer 220 remains on the interposer substrate SB2, and another part of the tether layer 220 is lifted along with the light emitting diode L by the transfer apparatus T. In this embodiment, the material of the transfer apparatus T, for example, includes polydimethylsiloxane (PDMS), and the transfer apparatus T lifts the light emitting diode L with the Van der Waals force between the transfer apparatus T and the light emitting diode L. In other embodiments, the transfer apparatus T lifts the light emitting diode L with, for example, vacuum attraction, static electricity, or the like.

Figure 1H:
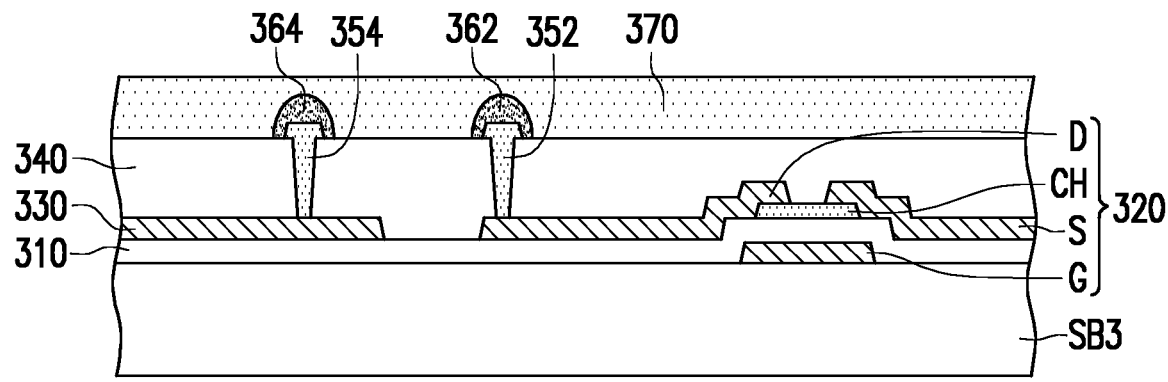

With reference to FIG. 1H, a first pad 354 and a second pad 352 are provided on a substrate SB3. In this embodiment, a switch element 320 and a common signal line 330 are located on the substrate SB3.

The switch element 320 includes a gate G, a channel layer CH, a source S, and a drain D. The gate G is located on the substrate SB3. A gate insulating layer 310 is located on the gate G. The channel layer CH is located on the gate insulating layer 310 and overlaps the gate G. The source S and the drain D are located on the channel layer CH and are electrically connected to the channel layer CH.

In this embodiment, the switch element 320 is a bottom gate type thin film transistor, but the disclosure is not limited thereto. In other embodiments, the switch element 320 is a top gate type thin film transistor, a double gate type thin film transistor, or a thin film transistor in any other form.

The common signal line 330, the source S, and the drain D are located on the gate insulating layer 310, and a planarization layer 340 is located on the common signal line 330, the source S, and the drain D. The first pad 354 and the second pad 352 penetrate the planarization layer 340, where the second pad 352 is electrically connected to the drain D of the switch element 320, and the first pad 354 is electrically connected to the common signal line 330. In other embodiments, the first pad 354 is electrically connected to the drain D of the switch element 320, and the second pad 352 is electrically connected to the common signal line 330.

The first pad 354 and the second pad 352 include conductive materials. For example, the materials of the first pad 354 and the second pad 352 are metal oxide conductive materials.

A first conductive structure 364 and a second conductive structure 362 are respectively formed on the first pad 354 and the second pad 352. The materials of the first conductive structure 364 and the second conductive structure 362 are, for example, solder, alloy, conductive metal, conductive organic matter, or other suitable materials.

An adhesive material layer 370 is formed on the substrate SB3. In this embodiment, the method for forming the adhesive material layer 370 includes, for example, a coating process. In addition, the adhesive material 370 covers the first conductive structure 364 and the second conductive structure 362. In some embodiments, the material of the adhesive material layer 370 includes a photoresist, such as a positive photoresist or a negative photoresist.

Figure 1I:
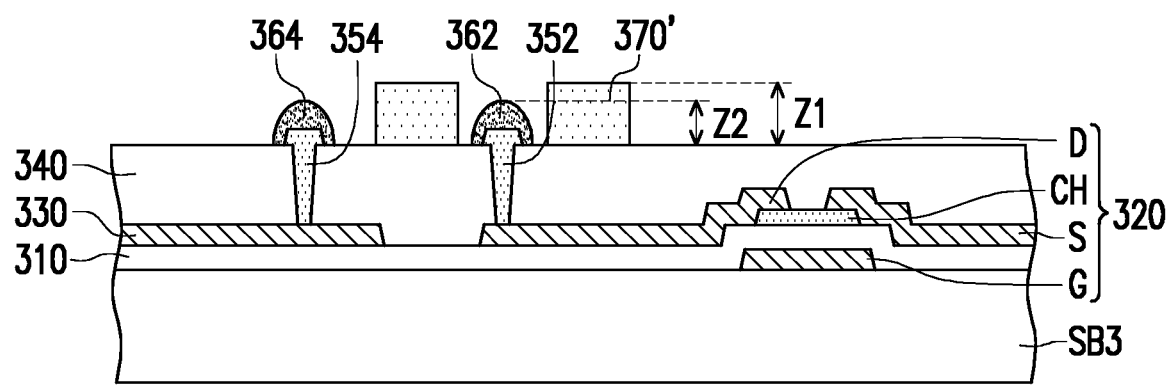

With reference to FIG. 1I, a soft-baking process is performed on the adhesive material layer 370 to remove excess solvent in the adhesive material layer 370. In some embodiments, a temperature of the soft-baking process is 60 degrees Celsius to 140 degrees Celsius.

An exposure and development process is performed on the adhesive material layer 370 to form a patterned adhesive material layer 370'. The patterned adhesive material layer 370' does not contact the first conductive structure 364 and the second conductive structure 362. In other words, the patterned adhesive material layer 370' exposes the first conductive structure 364 and the second conductive structure 362.

In some embodiments, a height Z1 of the patterned adhesive material layer 370' is higher than a height Z2 of the first conductive structure 364 and the second conductive structure 362. For example, the height Z1 of the patterned adhesive material layer 370' is 1 μm to 2 μm, and the height Z2 of the first conductive structure 364 and the second conductive structure 362 is 0.8 μm to 1.8 μm.

Figure 1J:
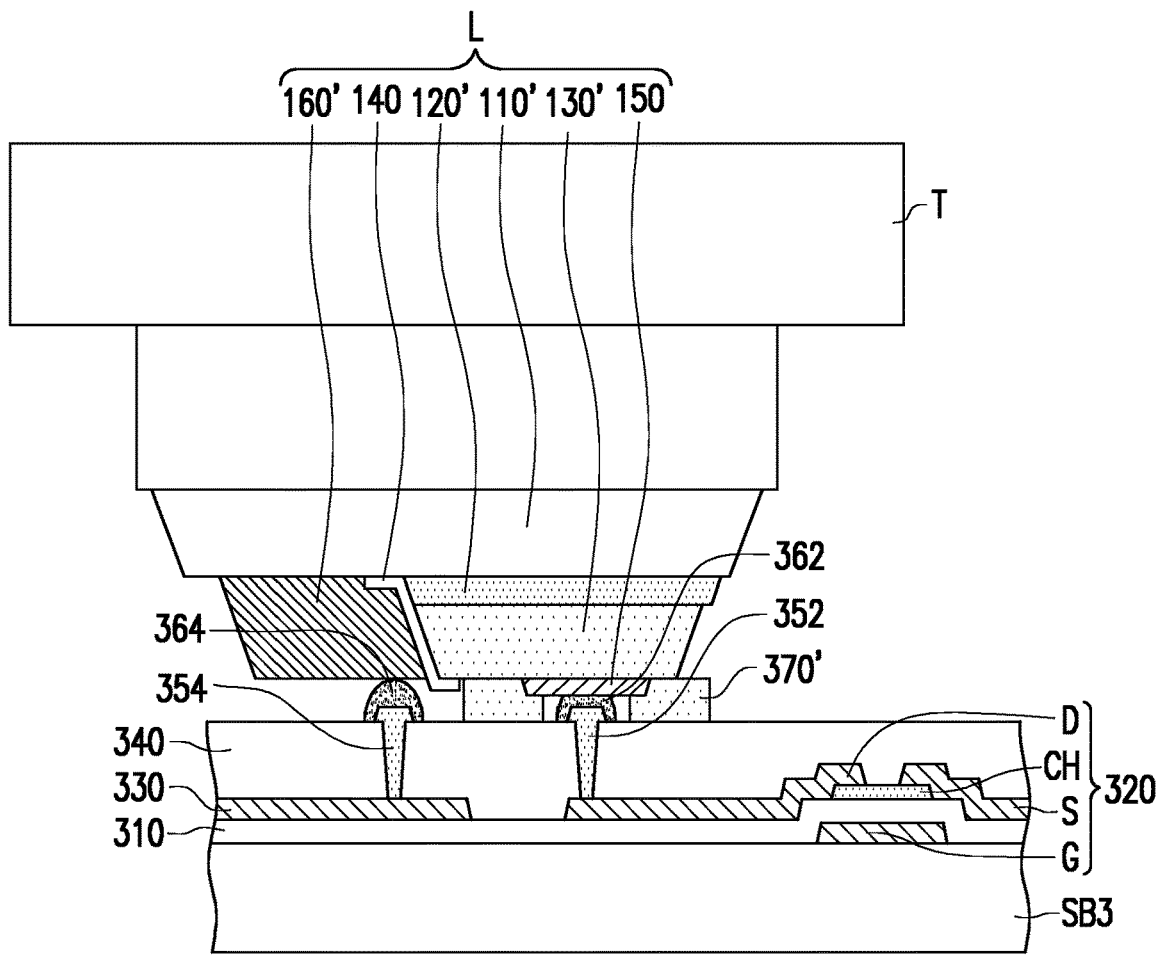

With reference to FIG. 1J, the light emitting diode L is placed on the patterned adhesive material layer 370' by the transfer apparatus T. In this embodiment, since the patterned adhesive material layer 370' is viscous in a normal temperature (or room temperature) environment, therefore, the light emitting diode L can be stuck without being welded with the first conductive structure 364 and the second conductive structure 362. In other words, when the light emitting diode L is transferred, the light emitting diode L can be adhered to the patterned adhesive material layer 370' without additionally increasing the temperature. In some embodiments, the light emitting diode L is pressed into the patterned adhesive material layer 370' so that the light emitting diode L contacts the first conductive structure 364 and the second conductive structure 362. For example, the first electrode 160' and the second electrode 150 are electrically connected to the first conductive structure 364 and the second conductive structure 362, respectively.

In this embodiment, an adhesive force between the patterned adhesive material layer 370' and the light emitting diode L is greater than an adhesive force between the transfer apparatus T and the light emitting diode L.

Figure 1K:
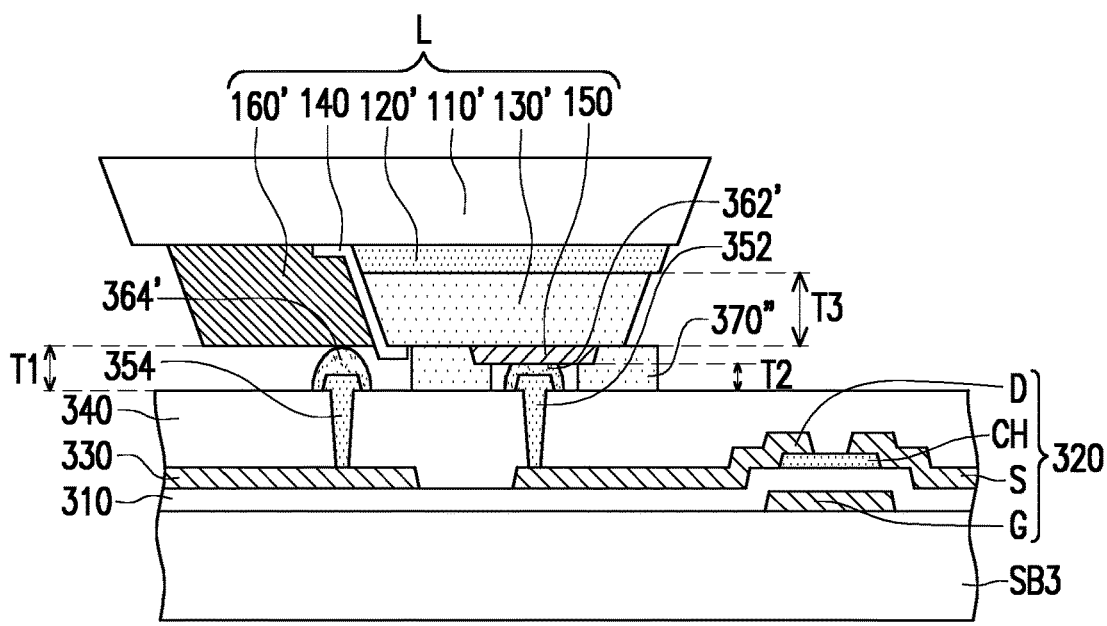

With reference to FIG. 1K and FIG. 2, the transfer apparatus T is removed, and then the patterned adhesive material layer 370' is heated to be cured into a patterned adhesive layer 370". When the patterned adhesive layer 370" is formed, the first conductive structure 364 is welded with the first electrode 160' to form a first connection structure 364' that electrically connects the first electrode 160' to the first pad 354, and the second conductive structure 362 is welded with the second electrode 150 to form a second connection structure 362' that electrically connects the second electrode 150 to the second pad 352. Thus far, a light emitting device 10 is substantially completed.

In this embodiment, a thickness T1 of the first connection structure 364' and a thickness T2 of the second connection structure 362' are smaller than a thickness T3 of the second semiconductor layer 130', but the disclosure is not limited thereto. In other embodiments, the thickness T1 of the first connection structure 364' is greater than the thickness T2 of the second connection structure 362', and the thickness T2 of the second connection structure 362' is greater than or equal to the thickness T3 of the second semiconductor layer 130'.

In some embodiments, a curing temperature of the patterned adhesive material layer 370' is greater than a fusion temperature of the first conductive structure 364 and the second conductive structure 362. Since the curing temperature of the patterned adhesive material layer 370' is greater than the fusion temperature of the first conductive structure 364 and the second conductive structure 362, the patterned adhesive material layer 370' do not crack easily due to excessively high temperature during the welding process of the conductive structure and the electrode. In some embodiments, the fusion temperature of the first conductive structure 364 and the second conductive structure 362 is 150 degrees Celsius to 250 degrees Celsius. In some embodiments, the curing temperature of the patterned adhesive material layer 370' is 180 degrees Celsius to 280 degrees Celsius.

In this embodiment, a patterned adhesive layer 370" surrounds the second connection structure 362', and a distance X1 between the patterned adhesive layer 370" and the second connection structure 362' is, for example, greater than 0.3 μm and less than 3 μm. In some embodiments, a distance X2 between the patterned adhesive layer 370" and the second pad 352 is, for example, greater than 0.3 μm and less than 3 μm. In some embodiments, a distance X3 between the patterned adhesive layer 370" and the first connection structure 364' is, for example, greater than 0.3 μm and less than 3 μm. In some embodiments, a distance X4 between the patterned adhesive layer 370" and the first pad 354 is, for example, greater than 0.3 μm and less than 3 μm.

In some embodiments, the shape of the patterned adhesive layer 370" includes a circle, a square, a polygon, or any other geometric shape. In addition, the patterned adhesive layer 370" is a closed ring or a non-closed ring. A level height of a top surface of the patterned adhesive layer 370" is lower than a level height of the light emitting layer 120' of the light emitting diode L, which thereby reduces negative effects of the patterned adhesive layer 370" on the luminous efficiency. In some embodiments, a width of the patterned adhesive layer 370" is smaller than a width of a single sub-pixel.

Based on the foregoing, it is possible to prevent misalignment of the light emitting diode L resulting from deformation of the transfer apparatus T due to the heating process. Besides, no additional heating is required when the light emitting diode L is being transferred, which not only greatly reduces process time for pressure welding, but also avoids adhesive material contamination during pressure welding.

Figure 3:
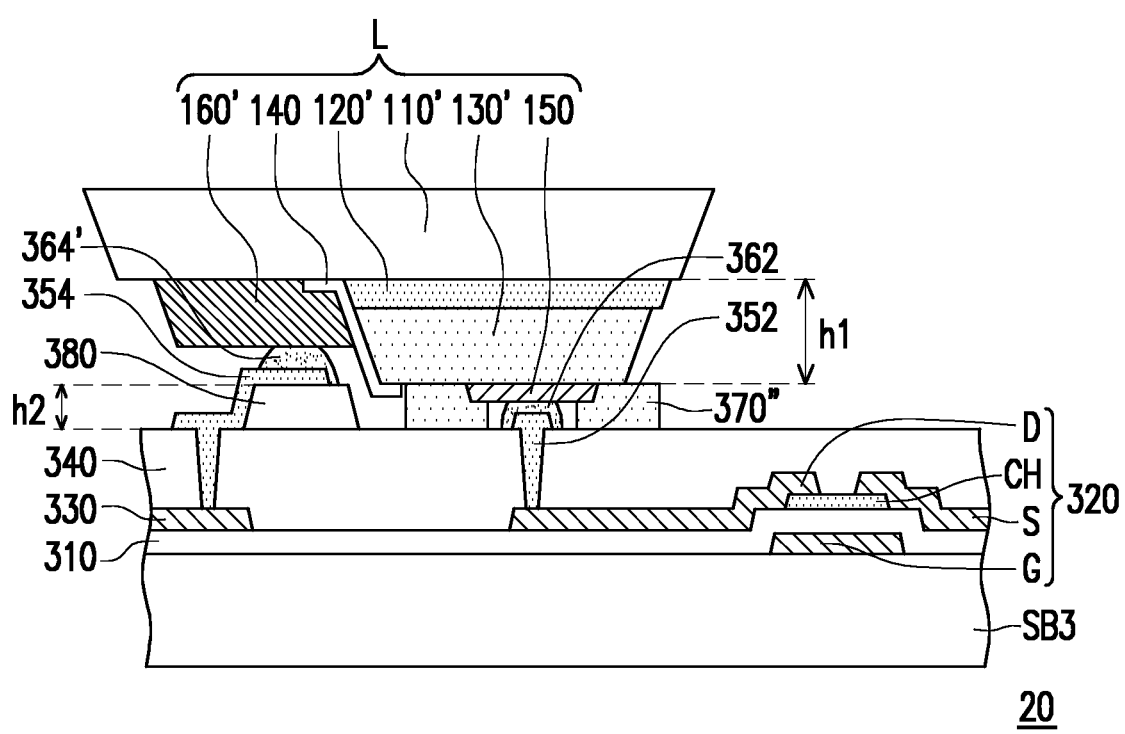
FIG. 3 is a schematic cross-sectional view of a light emitting device according to an embodiment of the disclosure.

FIG. 3 is a schematic cross-sectional view of a light emitting device according to an embodiment of the disclosure. It should be noted that the reference numerals and part of the content of the embodiment of FIG. 1A to FIG. 2 remain to be used in the embodiment of FIG. 3, the same or similar reference numerals are adopted to represent the same or similar elements, and description of the same technical content is omitted. Reference may be made to the abovementioned embodiment for the description of the omitted part, which will not be repeated herein.

With reference to FIG. 3, in a light emitting device 20, a surface of the substrate SB3 is provided with a bump 380, and the first pad 354 is disposed on the bump 380.

In some embodiments, a height difference h1 is present between a top surface of the first semiconductor layer 110' and the top surface of the second semiconductor layer 130', and a difference between a height h2 of the bump 380 and the height difference h1 is less than or equal to 1 μm, such as 0.3 μm to 0.5 μm.

By disposing the bump 380, a difference between a thickness of the first electrode 160' and a thickness of the second electrode 150 of the light emitting diode L can be reduced. In some embodiments, the thickness of the first electrode 160' are approximately the same as the thickness of the second electrode 150, and the first electrode 160' and the second electrode 150 are formed at the same time.

Based on the foregoing, it is possible to prevent misalignment of the light emitting diode L resulting from deformation of the transfer apparatus T due to the heating process. Besides, no additional heating is required when the light emitting diode L is being transferred, which not only greatly reduces process time for pressure welding, but also avoids adhesive material contamination during pressure welding.

Figure 4A:
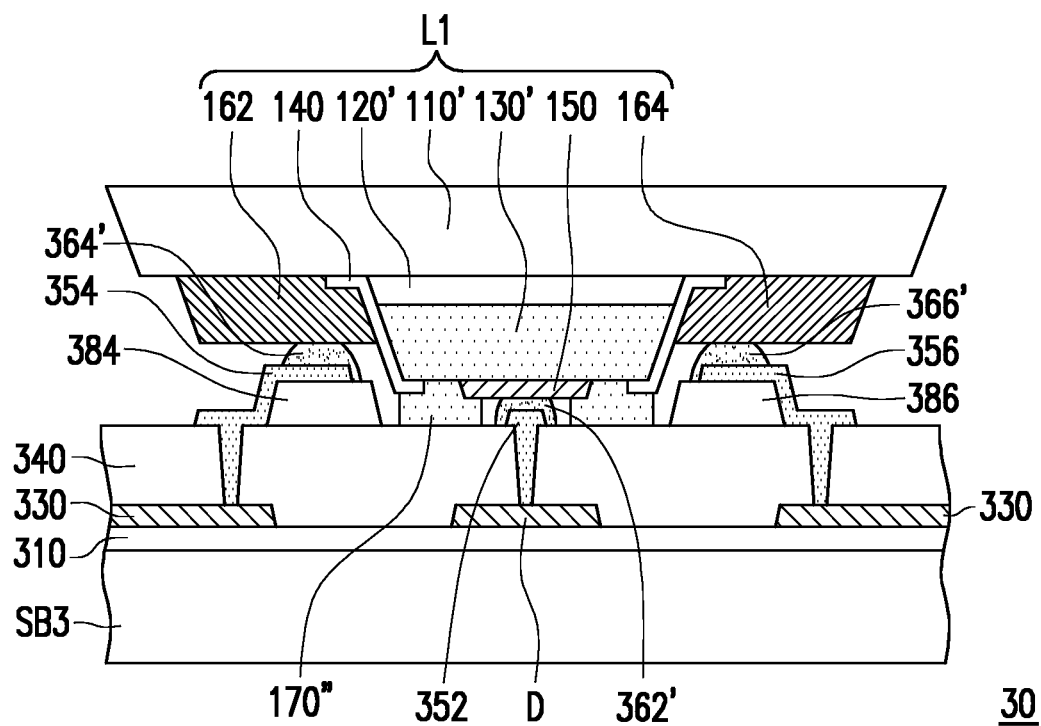
FIG. 4A is a schematic cross-sectional view of a light emitting device according to an embodiment of the disclosure.
Figure 4B:
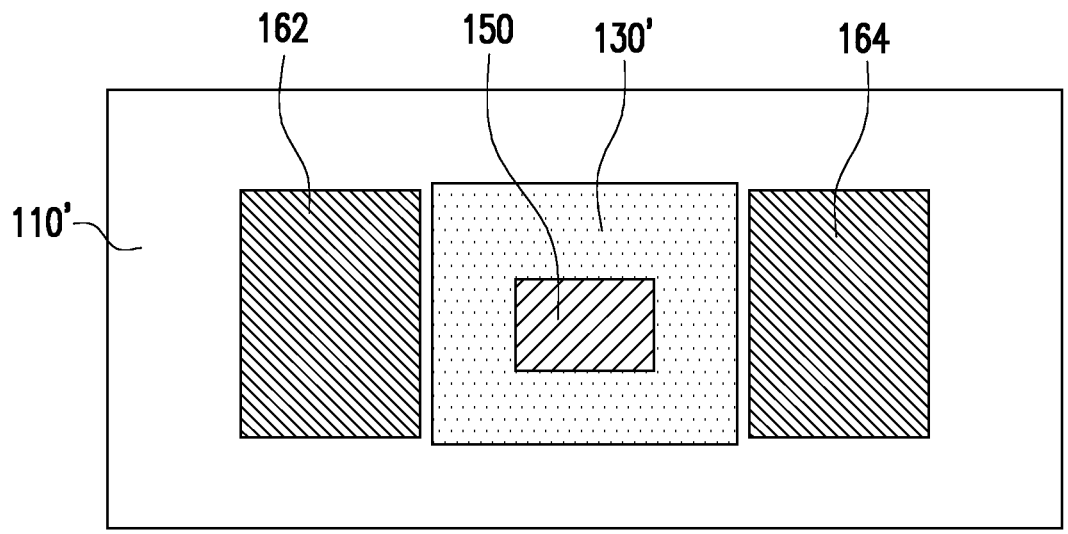
FIG. 4B is a schematic top view of a light emitting diode according to an embodiment of the disclosure.

FIG. 4A is a schematic cross-sectional view of a light emitting device according to an embodiment of the disclosure. FIG. 4B is a schematic top view of a light emitting diode according to an embodiment of the disclosure. It should be noted that the reference numerals and part of the content of the embodiment of FIG. 3 remain to be used in the embodiment of FIG. 4A and FIG. 4B, the same or similar reference numerals are adopted to represent the same or similar elements, and description of the same technical content is omitted. Reference may be made to the above-mentioned embodiment for the description of the omitted part, which will not be repeated herein.

With reference to FIG. 4A and FIG. 4B, in a light emitting device 30, the light emitting diode L1 further includes a third electrode 164. The third electrode 164, for example, is formed at the same time as a first electrode 162. The first electrode 162 and the third electrode 164 are connected to the first semiconductor layer 110', and the first electrode 162 and the third electrode 164 are separated from the second semiconductor layer 130' by the insulating layer 140. The second semiconductor layer 130' is located between the first electrode 162 and the third electrode 164. In this embodiment, the light emitting diode L1 has a bilaterally symmetrical structure, to thereby improve warping to one side of the light emitting diode L1 generated during transfer and pressuring.

The first pad 354, the second pad 352 and a third pad 356 are located on the substrate SB3. The surface of the substrate SB3 is provided with a bump 384 and a bump 386. The first pad 354 is disposed on the bump 384, and the third pad 356 is disposed on the bump 386.

The first electrode 162 is welded to the first connection structure 364', and is electrically connected to the first pad 354 through the first connection structure 364'. The second electrode 150 is welded to the second connection structure 362', and is electrically connected to the second pad 352 through the second connection structure 362'. The third electrode 164 is welded to a third connection structure 366', and is electrically connected to the third pad 356 through the third connection structure 366'.

In this embodiment, the patterned adhesive layer 170" is located between the second connection structure 362' and the first connection structure 364' and between the second connection structure 362' and the third connection structure 366'.

In this embodiment, the first electrode 162 and the third electrode 164 are electrically connected to the common signal line 330, and the second electrode 150 is electrically connected to the drain D of the switch element. In other embodiments, the first electrode 162 and the third electrode 164 are electrically connected to the drain D of the switch element, and the second electrode 150 is electrically connected to the common signal line 330.

Based on the foregoing, it is possible to prevent misalignment of the light emitting diode L resulting from deformation of the transfer apparatus due to the heating process. Besides, no additional heating is required when the light emitting diode L is being transferred, which not only greatly reduces process time for pressure welding, but also avoids adhesive material contamination during pressure welding.

Figure 5A:
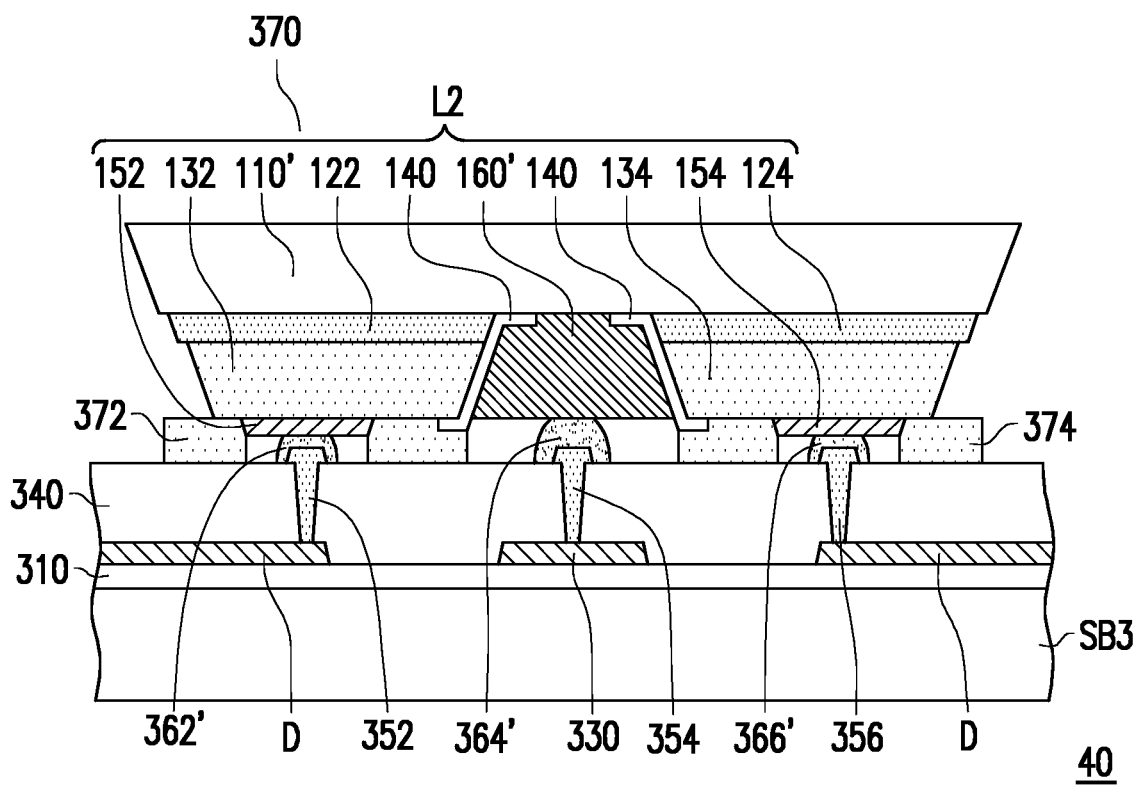
FIG. 5A is a schematic cross-sectional view of a light emitting device according to an embodiment of the disclosure.
Figure 5B:
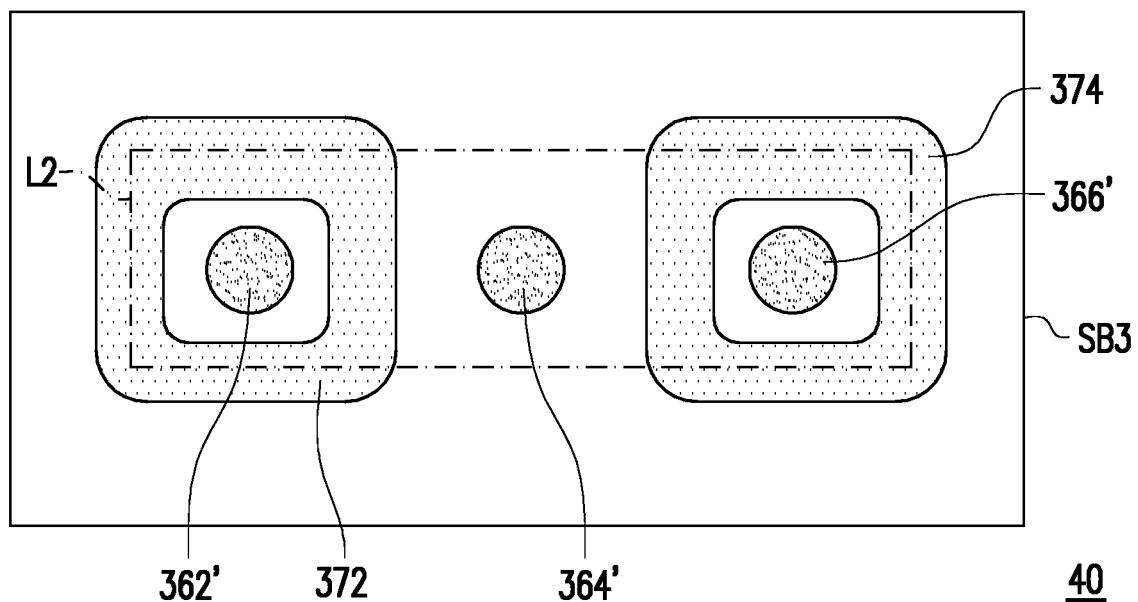
FIG. 5B is a schematic top view of a light emitting device according to an embodiment of the disclosure.

FIG. 5A is a schematic cross-sectional view of a light emitting device according to an embodiment of the disclosure. FIG. 5B is a schematic top view of a light emitting device according to an embodiment of the disclosure. It should be noted that the reference numerals and part of the content of the embodiment of FIG. 3 remain to be used in the embodiment of FIG. 5A and FIG. 5B, the same or similar reference numerals are adopted to represent the same or similar elements, and description of the same technical content is omitted. Reference may be made to the above-mentioned embodiment for the description of the omitted part, which will not be repeated herein.

With reference to FIG. 5A and FIG. 5B, in a light emitting device 40, a light emitting diode L2 further includes a third electrode 154, a third semiconductor layer 134, and a light emitting layer 124. For example, the light emitting layer 124 is formed at the same time as a light emitting layer 122, the third semiconductor layer 134 is formed at the same time as a second semiconductor layer 132, and the third electrode 154 is formed at the same time as a second electrode 152. The second semiconductor layer 132 and the third semiconductor layer 134 are respectively located on the light emitting layer 122 and the light emitting layer 124, and the second electrode 152 and the third electrode 154 are respectively connected to the second semiconductor layer 132 and the third semiconductor layer 134. The first electrode 160' is located between the third semiconductor layer 134 and the second semiconductor layer 132, and is separated from the third semiconductor layer 134 and the second semiconductor layer 132 by the insulating layer 140. In this embodiment, the light emitting diode L2 has a bilaterally symmetrical structure, to thereby improve warping to one side of the light emitting diode L2 generated during transfer and pressuring.

The first electrode 160' is welded to the first connection structure 364', and is electrically connected to the first pad 354 through the first connection structure 364'. The second electrode 152 is welded to the second connection structure 362', and is electrically connected to the second pad 352 through the second connection structure 362'. The third electrode 154 is welded to the third connection structure 366', and is electrically connected to the third pad 356 through the third connection structure 366'.

In this embodiment, a patterned adhesive layer 372 surrounds the second connection structure 362' and is located between the second connection structure 362' and the first connection structure 364'. The patterned adhesive layer 374 surrounds the third connection structure 366' and is located between the second connection structure 362' and the third connection structure 366'.

Based on the foregoing, it is possible to prevent misalignment of the light emitting diode L resulting from deformation of the transfer apparatus T due to the heating process. Besides, no additional heating is required when the light emitting diode L is being transferred, which not only greatly reduces process time for pressure welding, but also avoids adhesive material contamination during pressure welding.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method for manufacturing a light emitting device, comprising:
   providing a first pad and a second pad on a substrate;
   forming a first conductive structure and a second conductive structure respectively on the first pad and the second pad;
   forming an adhesive material layer on the substrate;
   performing a soft-baking process on the adhesive material layer, and patterning the adhesive material layer, wherein the patterned adhesive material layer does not contact the first conductive structure and the second conductive structure;

placing a light emitting diode on the patterned adhesive material layer, wherein the light emitting diode comprises:
  a first semiconductor layer and a second semiconductor layer overlapping the first semiconductor layer; and
  a first electrode and a second electrode respectively connected to the first semiconductor layer and the second semiconductor layer, wherein the first electrode and the second electrode are respectively connected to the first conductive structure and the second conductive structure.

2. The method according to claim 1, further comprising:
heating the second conductive structure and the first conductive structure to form a second connection structure and a first connection structure, wherein the second connection structure electrically connects the second electrode to the second pad, and the first connection structure electrically connects the first electrode to the first pad.

3. The method according to claim 1, wherein a method for manufacturing the light emitting diode comprises:
  forming a second semiconductor material layer on a first semiconductor material layer;
  patterning the second semiconductor material layer to form the second semiconductor layer;
  forming an insulating layer on a sidewall of the second semiconductor layer;
  forming the second electrode on the second semiconductor layer;
  forming a metal material layer on the first semiconductor material layer, wherein the metal material layer contacts the insulating layer; and
  patterning the first semiconductor material layer and the metal material layer to form the first semiconductor layer and the first electrode.

4. The method according to claim 1, further comprising heating the patterned adhesive material layer to cure the patterned adhesive material layer into a patterned adhesive layer, wherein a curing temperature of the patterned adhesive material layer is greater than a fusion temperature of the first conductive structure and the second conductive structure.

5. The method according to claim 4, wherein the fusion temperature of the first conductive structure and the second conductive structure is 150 degrees Celsius to 250 degrees Celsius.

6. The method according to claim 4, wherein a temperature of the soft-baking process is 60 degrees Celsius to 140 degrees Celsius.

7. The method according to claim 4, wherein the method for patterning the adhesive material layer comprises an exposure and development process.

* * * * *